United States Patent
Popescu et al.

(10) Patent No.: US 6,466,061 B2
(45) Date of Patent: Oct. 15, 2002

(54) HIGH SPEED VARIABLE OUTPUT POWER DRIVER

(75) Inventors: Petre Popescu; Paul T. Banens, both of Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/847,296

(22) Filed: May 3, 2001

(65) Prior Publication Data

US 2002/0050845 A1 May 2, 2002

(51) Int. Cl.[7] .................................................. H03K 3/00
(52) U.S. Cl. ....................... 327/108; 327/112; 327/563
(58) Field of Search ..................... 327/63, 65, 108–112, 327/560–563; 330/252, 254

(56) References Cited

U.S. PATENT DOCUMENTS 5,872,475 A * 2/1999 Otaka .......................... 327/308
5,914,630 A * 6/1999 Peterson ....................... 327/65
5,936,475 A * 8/1999 Tchamov et al. ............ 327/266
6,049,252 A * 4/2000 Iwata .......................... 330/254

* cited by examiner

Primary Examiner—Kenneth B. Wells

(57) ABSTRACT

The invention relates to a driver circuitry suitable for controlling an operation of a laser or an optical modulator and providing extended dynamic range of the output power and enhanced quality of the output signal. It comprises a power control unit, a pre-driver stage and an output stage. The pre-driver stage and the output stage include differential amplifiers, the output stage amplifier preferably having a cascode configuration. The pre-driver stage provides a preliminary amplification of an input signal which is received and further amplified by the output stage. The power control unit operates in response to a reference signal, e.g. variable DC voltage or a feedback signal, and generates two control signals which control operating points of the pre-driver and the output stage in such a manner that higher output power of the driver corresponds to the higher output signal from the pre-driver stage. Conveniently, both the pre-driver stage and the output stage may be controlled by the same control signal. Depending on the product requirements, the driver circuit can be monolithically integrated with a device to be driven by the circuit.

7 Claims, 4 Drawing Sheets

HIGH SPEED VARIABLE OUTPUT POWER DRIVER

FIELD OF THE INVENTION

The invention relates to a driver circuitry, and in particular, to the driver circuitry which provides high speed variable output power and high performance operation within a wide dynamic range.

BACKGROUND OF THE INVENTION

Output power drivers have found numerous applications in telecommunications, microelectronics and other hi-technology industries. In fiber optics industry, for example, such drivers are widely used for direct modulation of lasers and optical modulators. Driver circuits designed for fiber optics applications must satisfy certain requirements, including operability in a controlled impedance environment, capability to deliver variable output power and provide a pre-determined output waveform within a wide dynamic range of power. Moreover, high level of circuit integration and demand for high speed operation impose an additional requirement for the driver circuitry to operate at a low voltage supply while maintaining other characteristics of the circuitry.

Unfortunately, existing laser driver circuits provide an optimum performance over a narrow range of the output power which doesn't guarantee sufficient quality of an optical eye output and requires high voltage supply to maintain the quality of the waveform at the required level. As a result, existing circuit designs are not compatible with high level of integration, high speed and low power requirements.

Accordingly, there is a need to develop a driver circuitry which would provide a high performance operation over a wide dynamic range of the output power.

SUMMARY OF THE INVENTION

It is therefore an object of the invention to provide a driver circuitry which would avoid the afore-mentioned problems.

According to one aspect of the invention there is provided a driver circuit, comprising an output stage having a first differential amplifier whose operating point is controlled by a first control signal. Preferably, the differential amplifier is a cascode amplifier. The circuit may further comprise a pre-driver stage having a second differential amplifier, the pre-driver stage being responsive to an input signal and generating an output pre-driver signal to be received by the output stage of the driver. Preferably, the operating point of the second differential amplifier is controlled by a second control signal. It is arranged that the operating points of the first and second differential amplifiers are controlled in such a manner that higher output power of the driver corresponds to the higher output pre-driver signal. Conveniently, the first and second control signals are generated by the same control unit. If required, it may be arranged that the generated signals are identical. The control unit is operating in response to a reference signal, e.g. variable DC voltage or a feedback signal supplied from the output of the driver. Alternatively, the feedback signal may be signal may be supplied from the output of the device being controlled by the driver circuit, e.g. from the output of a laser or an optical modulator. Beneficially, the driver circuit is monolithically integrated with a device to be driven by the circuit.

According to another aspect of the invention there is provided a driver circuit, comprising a pre-driver stage having a differential amplifier whose operating point is controlled in such a manner that higher output power of the driver corresponds to the higher output signal from the pre-driver.

According to another aspect of the invention there is provided a pre-driver stage for a driver circuit, the pre-driver stage providing a preliminary amplification of an input signal and comprising a differential amplifier whose operating point is controlled in such a manner that higher output power of the driver corresponds to the higher output signal from the pre-driver.

According to one more aspect of the invention there is provided a driver circuit, comprising:

a power control unit;

a pre-driver stage and an output stage;

the power control unit being responsive to a reference signal and generating first and second control signals;

the pre-driver stage comprising a second differential amplifier and being responsive to an input signal and the second control signal and generating an output pre-driver signal, the output pre-driver signal being a preliminary amplified input signal;

the output stage comprising a first differential amplifier and being responsive to the output pre-driver signal and the first control signal and generating the output driver signal;

the first and second control signals controlling operating points of the first and second differential amplifiers respectively.

Control of the operating points of the first and second differential amplifiers is provided in such a manner that higher output power of the driver corresponds to the higher output pre-driver signal.

According to yet another aspect of the invention there is provided a method of operating a driver circuit, the circuit comprising an output stage having a first differential amplifier and a pre-driver stage having a second differential amplifier, the pre-driver being responsive to an input signal and generating an output pre-driver signal to be received by the output stage, the method comprising controlling of operating points of the output stage and the pre-driver stage in such a manner that higher output power of the driver corresponds to the higher output signal from the pre-driver.

Additionally, the method may comprise the step of controlling operating points of the output stage and the pre-driver stage by first and second control signals, the signals being identical.

The proposed architecture of the driver circuit provides an extended dynamic range of the output power of the driver and improved waveform quality of the output signal.

BRIEF DESCRIPTION OF THE DRAWINGS

One embodiment of the invention will now be described, by way of example, with reference to the accompanying drawings in which.

DETAILED DESCRIPTION OF THE EMBODIMENTS

Figure 1:
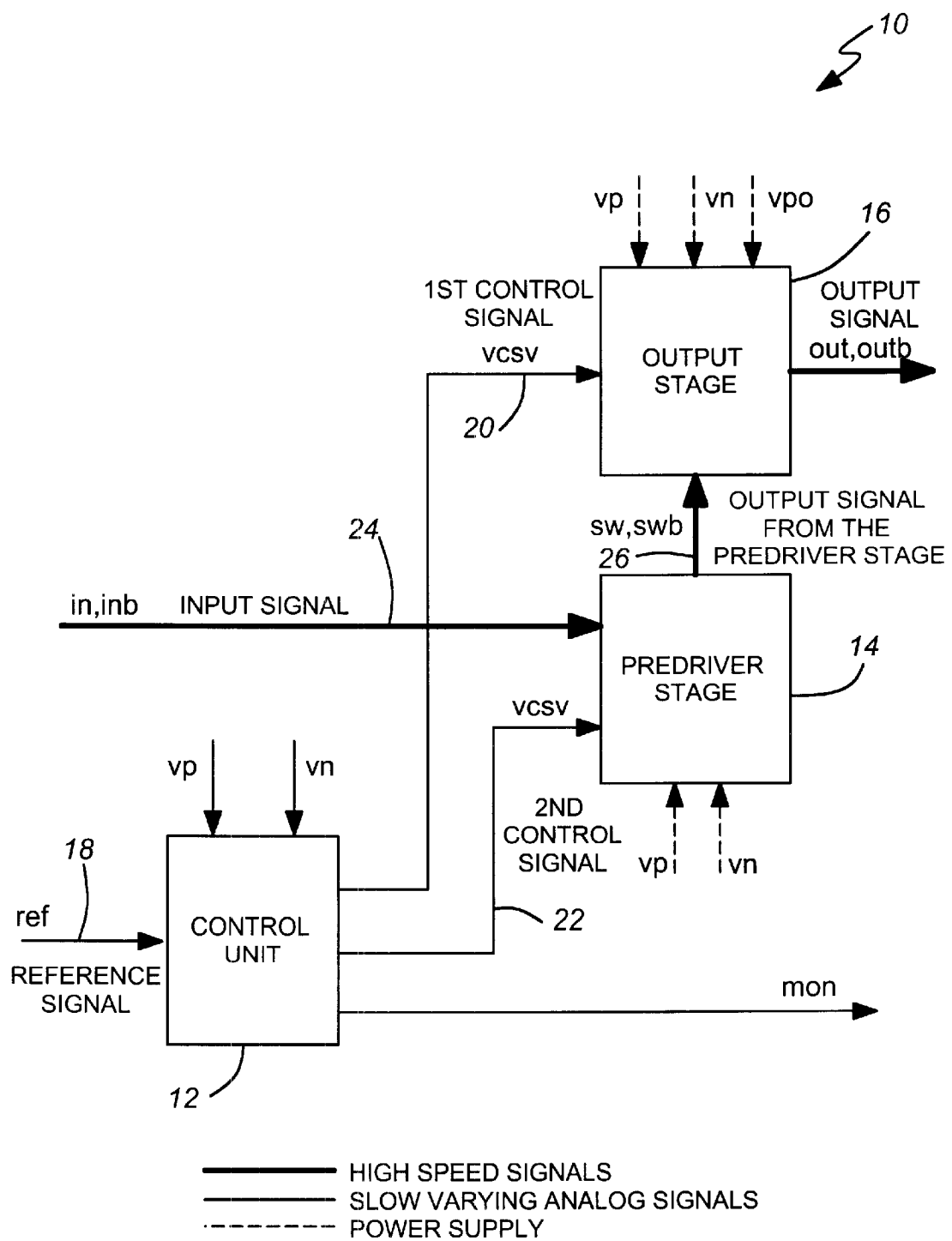
FIG. 1 is a block diagram of the driver circuit according to an embodiment of the invention.

A driver circuit 10 according to the embodiment of the invention is shown in FIG. 1. It comprises a power control unit 12, a pre-driver stage 14 and an output stage 16 designed so as to provide control of operation of a semiconductor laser device. The control unit 12 is operable in response to a reference signal 18, the reference signal being a variable DC voltage or a feedback signal, and generating first and second control signals 20 and 22 respectively. The output stage 16 and the pre-driver stage 14 include first and second differential amplifiers, the output stage amplifier having a cascode switch configuration shown in FIG. 2. The pre-driver stage 14 is responsive to an input signal 24 and the second control signal 22 and generates an output pre-driver signal 26, the output pre-driver signal 26 being a preliminary amplified input signal 24. The first and second control signals 20 and 22 generated by the control unit 12 control operating points of the first and second differential amplifiers of the output stage 16 and pre-driver 14 respectively in such a manner that higher output power of the driver corresponds to the higher output signal from the pre-driver stage as will be described in detail below. Conveniently, as illustrated in FIG. 1, both the pre-driver stage 14 and the output stage 16 are controlled by the same control signal "vcsv" (variable current source voltage). The pre-driver 14 and the cascode switch 16 are fully differential to minimize noise generation. The main power supply is connected between "vp" (positive) and "vn" (negative) voltages. Depending on the maximum output power requirements the cascode switch may have a separate power supply (vpo, vn). The input signal 24 has non-inverting and inverting components labeled as "in" and "inb" respectively, with the output pre-driver signal having corresponding non-inverting and inverting components labeled as "sw" and "swb". Accordingly, the cascode switch 16 provides two outputs, "out "(non-inverted) and "outb" (inverted) to be used for different applications. The two outputs are 50 Ohm on chip terminated to provide the source impedance. The outputs are AC coupled to 50 Ohm loads. The required relationship between the output voltage peak to peak swing and the input control voltage is assumed to be linear., i.e.

$$V_{out,pp} = k \cdot V_{ref} \quad (1)$$

The output power control is implemented by adjusting operating points of the pre-driver 14 and the cascode switch 16. A detailed description of the structure and operation of the driver circuit 10 is given below.

Output stage (Cascode Switch)

Figure 2:
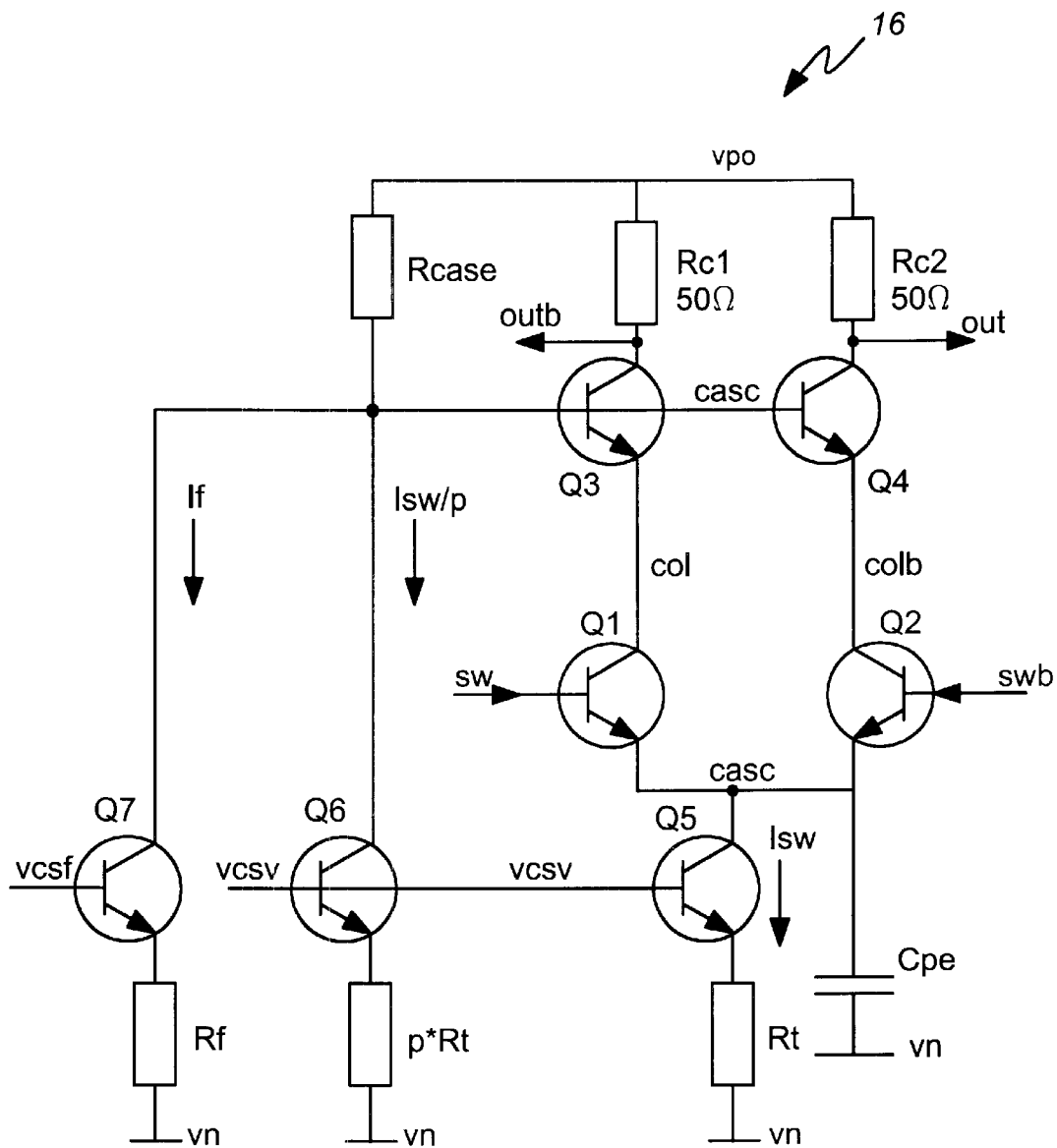
FIG. 2 illustrates a schematic of the output stage of the driver circuit of FIG. 1.

The cascode switch 16 comprises a first differential amplifier including a main switch formed by transistors Q1 and Q2, and cascode stage formed by transistors Q3 and Q4 as shown in FIG. 2. The collectors of the cascode transistors are connected to the output "out" and "outb" respectively. The two source resistors Rc1 and Rc2 are assumed to have 50Ω nominal values. The base of the cascode devices are connected to a common bias designated as "casc".

The collectors of the transistors, forming the main switch and being designated as "col" and "colb", are connected to the two emitters of the cascode transistors. The inputs to the main switch are designated as "sw" and "swb" as mentioned above.

The switch current is assumed to be controlled by a current source formed by transistor Q5 and resistor Rt. By varying the base voltage of the current source (vcsv), the operating current is adjusted to the desired value (Isw). A simplified relationship between the output voltage on a 50Ω load and the switch current can be written neglecting the base current in the main switch and the cascode transistors, accounting for the base current in the power control unit 12.

$$V_{out,pp} = 50\Omega \cdot I_{sw,pp} \cdot \frac{R_c}{R_c + 50\Omega} \quad (2)$$

where $$R_c = R_{c1} = R_{c2}$$

The cascode collector current can be written as a sum of a continuous current and a variable current $$I_{col} = \frac{I_{sw}}{2} + I_{sw,pp} \quad (3)$$

and the current flowing through the collector resistors Rc1 and Rc2

$$I_{R_c} = \frac{I_{sw}}{2} + \left(I_{sw} - I_{sw} \cdot \frac{R_c}{R_c + 50\Omega}\right) pp \quad (4)$$

In order to simplify the analysis, we assume that collector resistor and the collector current becomes $$I_{R_c} = \frac{I_{sw}}{2} + \frac{I_{sw}}{2} pp \quad (5)$$

The cascode collector voltage has a maximum value when the corresponding transistor in the main switch is "off", and a minimum value when the transistor is "on".

The cascode bias voltage Vcasc is controlled by the resistor Rcasc and the sum of two currents, namely by If which is a constant current, and by Isw/p which is a variable current, or scaled down switch current $$V_{col,max} = vpo - R_c \cdot \frac{I_{sw}}{4} \quad (6)$$

When the cascode device is "off", the collector base voltage is $$V_{CB} = vpo - R_c \cdot \frac{I_{sw}}{4} - V_{case} \quad (7)$$

When the cascode device is "on", the cascode collector voltage has the minimum value and the collector emitter voltage can be expressed as $$V_{col,min} = vpo - R_c \cdot \frac{3}{4} \cdot I_{sw} \quad (8)$$

$$V_{CB} = vpo - R_c \cdot \frac{3}{4} \cdot I_{sw} - V_{case} - V_{be} \quad (9)$$

The equations (6) to (9) can be used to calculate power supply value needed for a given maximum output voltage and to evaluate the breakdown and saturation conditions.

Assuming that a condition $V_{ce} > V_{be}$ is used as a saturation limit for maximum output power for all devices forming the cascode switch, i.e. cascode stage, main switch and current source, we can write $$vpo - vn \geq R_c \cdot \frac{3}{4} \cdot I_{sw} + 3 \cdot V_{be} + R_t \cdot I_{sw,\max} \quad (10)$$

Correspondingly, the voltage drop across $R_{casc}$ at maximum output power becomes $$V_{Rcase,\max} = R_{case} \cdot \left(I_f + \frac{I_{sw,\max}}{p}\right) \quad (11)$$

In order to avoid cascode saturation at the maximum output power, the collector voltage must be higher or equal to the base voltage $$R_{case} \cdot \left(I_f + \frac{I_{sw,\max}}{p}\right) \geq R_c \cdot \frac{3}{4} \cdot I_{sw,\max} \quad (12)$$

A similar condition can be derived for protecting the main switch against saturation at the maximum output power. The maximum input voltage on the switch input ($V_{sw,max}$) must satisfy the condition given by the following equation $$V_{sw,\max} \leq vpo - R_{casc} \cdot (I_f + I_{sw,\max}) - V_{be} \quad (13)$$

In order to avoid saturation in the switch current source (Q5, Rt), the maximum input voltage on the switch input at the maximum power must satisfy an additional requirement below:

$$R_t I_{sw,\max} + V_{be} \leq V_{sw,\max} \leq vpo - R_{casc} \cdot (I_f + I_{sw,\max}) - V_{be} \quad (14)$$

The conditions given by equations (12) and (14) allow to design the cascode switch so that the saturation is avoided at the maximum output power and control of the operating point of the cascode switch is provided.

An additional set of conditions can be defined to avoid breakdown at the minimum output power when the tail current has the minimum value $I_{sw,min}$. In order to optimize the design, we can divide the voltage equally across the three devices (cascode stage, switch and current source)

$$V_{ce,cascode} \approx V_{ce,switch} \approx V_{ce,Q5} \approx \quad (15)$$
$$\frac{1}{3} \cdot \left((vpo - vn) - \left(R_c \cdot I_{sw,\min} \cdot \frac{3}{4}\right) - (R_i \cdot I_{sw,\min})\right)$$

The resulting conditions for the cascode bias voltage and the switch input voltage are given in the following equations $$R_{casc} \cdot \left(I_f + \frac{I_{sw,\min}}{p}\right) \approx \quad (16)$$
$$R_c \cdot I_{sw,\min} \cdot \frac{1}{2} + \frac{1}{3} \cdot ((vpo - vn) - (R_i \cdot I_{sw,\min})) - V_{be}$$

$$V_{sw,\min} \approx vpo - \frac{2}{3} \cdot \left((vpo - vn) - \left(R_c \cdot I_{sw,\min} \cdot \frac{3}{4}\right) - (R_i \cdot I_{sw,\min})\right) + V_{be} \quad (17)$$

This equation can be rewritten $$V_{sw,\min} \approx \quad (18)$$
$$\left(vpo - \left(\frac{2}{3} \cdot (vpo - vn)\right)\right) + \left(R_c \cdot I_{sw,\min} \cdot \frac{1}{2}\right) + \frac{2}{3} \cdot (R_i \cdot I_{sw,\min}) + V_{be}$$

The equation (15) allows to select the technology for a given application, while equations (16) and (18) are used to design the cascode switch to satisfy the breakdown conditions at the minimum output power. The same set of equations can be used to define the operating conditions of the cascode stage and the main switch over the dynamic range of the output power. The circuit topology described above has a capability to adaptively adjust the operating conditions as a function of the output power.

Pre-driver Stage

The pre-driver stage performs two functions. It isolates the other circuits from the cascode switch and provides power amplification. Additionally, it provides an optimum output signal ("sw","swb") for the cascode switch depending on the required output power in accordance with equations (14) and (18).

Figure 3:
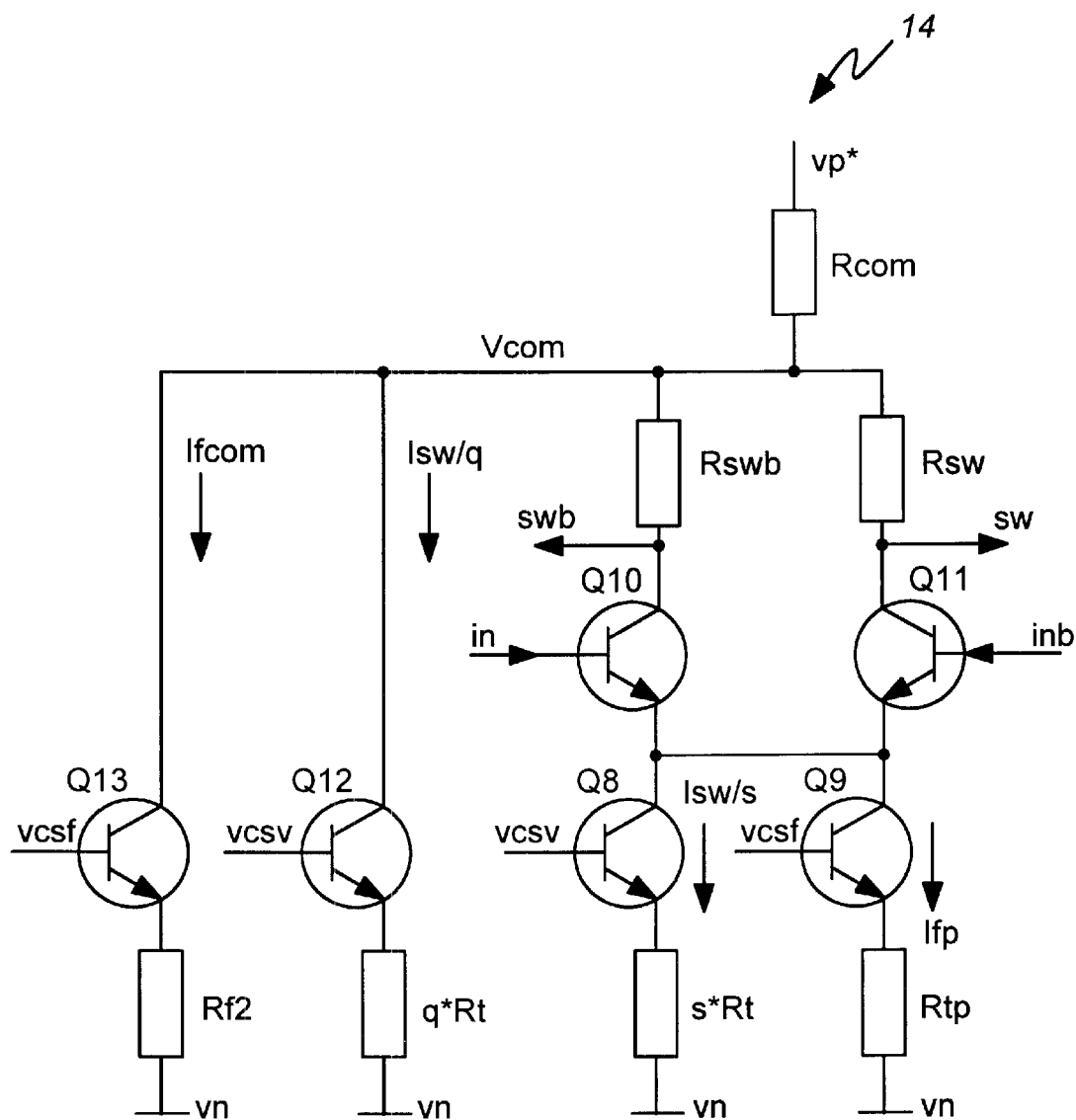
FIG. 3 illustrates a schematic of the pre-driver stage of the driver circuit of FIG. 1.

The pre-driver stage 14 shown in FIG. 3 comprises a second differential amplifier including a differential pair Q10 and Q11 having collector resistors $R_{sw}$ and $R_{swb}$. The tail current is provided by two current sources Q8 (variable current) and Q9 (constant current). The outputs are taken from the collectors ("sw" and "swb") as shown in FIG. 3.

The pre-driver high output voltage is controlled by a common mode resistor Rcom, the pre-driver current and a sum of two currents provided by two current sources Q13 (constant current) and Q12 (variable current).

$$V_{pr,out} = R_{sw} \cdot \left(I_{fp} + \frac{I_{sw}}{s}\right) \quad (19)$$

where "s" is a scaling factor.

Reducing the switch input voltage at low output power and increasing the switch input voltage at high output power, allows to maintain the rise and fall times and the crossing point at ~50% of the output amplitude over the output power dynamic range.

The pre-driver high output voltage value increases at low output power and decreases at high output power, as required by equations (14) and (18) in the previous section:

$$V_{pr,high} = vp_{pr} - R_{com} \cdot \left(I_{fcom} + I_{fp} + \frac{I_{sw}}{q} + \frac{I_{sw}}{s}\right) \quad (20)$$

The proposed pre-driver architecture satisfies all the requirements for optimum cascode switch operation.

Power Control Unit

Figure 4:
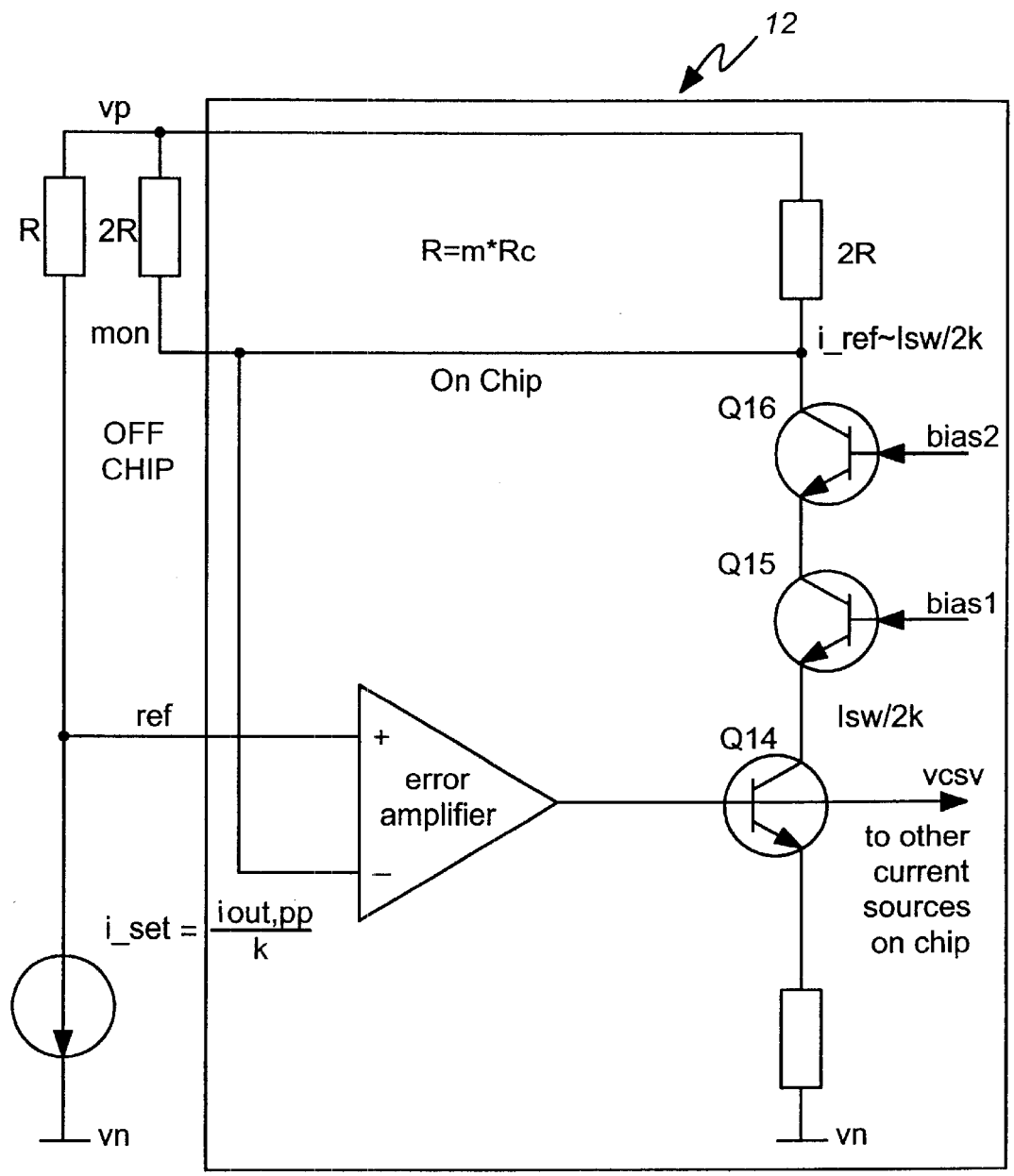
FIG. 4 illustrates a schematic of the power control unit of the driver circuit of FIG. 1.

The circuit schematic of the output power control unit 12 is shown in FIG. 4, wherein "i_set" is a power level control current and R is an off chip resistor generating a reference voltage Vref. This voltage is a DC or slow varying voltage.

The transfer function from the control current to the output voltage can be written $$V_{out,pp} = k \cdot i_{set} \cdot 50\Omega \quad (21)$$

The on chip error amplifier generates the bias voltage "vcsv" (see FIG. 2 and FIG. 3) to control the cascode switch tail current and the first operating point of the cascode and the second operating point of the pre-driver. A scaled down tail current (transistor Q14) is used to monitor the cascode switch tail current. The on chip and off chip resistors 2R monitor the current division between the on chip termination and the external load, as expressed in equation (2). For optimum performance, it is recommended that the internal resistor 2R in the control loop is matching with the internal termination resistor Rc (see equation 2). The cascode switch base current compensation is provided by the two transistors Q15 and Q16 in FIG. 4. For optimum performance, it is recommended that the two bias voltages,"bias1" and "bias2" track "Vcom" (FIG. 3) and "casc" (FIG. 2) respectively.

Thus, the driver circuit 10 having adaptive control of operating points of the pre-driver and the output stage is provided. The operating points, responsible for coefficients of amplification of the corresponding differential amplifiers, are controlled in such a manner that higher output power of the driver corresponds to the higher output signal from the pre-driver stage. As a result, the dynamic range of the driver is substantially enhanced, quality of the output waveform over the output power range is improved, and adaptive capability for the output stage to avoid breakdown and saturation conditions over the range of the output power is achieved.

While the circuit 10 of the embodiment described above provides adaptive control of the operating points of both the pre-driver stage and the output stage, the alternative embodiments may provide control of the operating point of the pre-driver only or the output stage only. Additional modifications of the circuit 10 may include monolithic integration of the driver circuit with the device to be driven, e.g. laser, modulator, cable driver. It is also contemplated that the circuit described may be used to other application where high speed operation and variable power output is required. While implementation of the driver 10 has been done for silicon bipolar/SiGe technology and operating in a 50 Ohm transmission environment, it is understood that circuit design may be adapted for other technologies and other source/termination impedances.

Thus, it will be appreciated that, while specific embodiments of the invention are described in detail above, numerous variations, combinations and modifications of these embodiments fall within the scope of the invention as defined in the following claims.

What is claimed is:

1. A driver circuit, comprising:
    an output stage having a first differential amplifier whose operating point is controlled by a first control signal;
    a pre-driver stage having a second differential amplifier, the pre-driver stage being responsive to an input signal and generating an output pre-driver signal to be received by the output stage of the driver, the operating point of said second differential amplifier being controlled by a second control signal and said first and second control signals being generated by the same control unit, wherein said unit is responsive to a feedback signal provided from the output of the driver.

2. A driver circuit as defined in claim 1, wherein the first and second control signals are identical.

3. A driver circuit as defined in claim 1, wherein the reference signal is a variable DC voltage.

4. A driver circuit as defined in claim 1, wherein said first differential amplifier is a cascode amplifier.

5. A driver circuit as defined in claim 1, wherein said driver circuit is used to drive a laser.

6. A driver circuit as defined in claim 5, wherein the reference signal is a feedback signal provided from the output of the laser.

7. A driver circuit as defined in claim 1, wherein the driver circuit is used to drive an optical modulator.

* * * * *